(12) United States Patent
Nakamura et al.

(10) Patent No.: US 7,169,331 B2
(45) Date of Patent: Jan. 30, 2007

(54) CONDUCTIVE PASTE AND CERAMIC MULTILAYER SUBSTRATE

(75) Inventors: Ryoji Nakamura, Shiga-ken (JP); Mitsuyoshi Nishide, Shiga-ken (JP)

(73) Assignee: Murata Manufacturing Co., Ltd (JP)

( * ) Notice: Subject to any disclaimer, the term of this patent is extended or adjusted under 35 U.S.C. 154(b) by 537 days.

(21) Appl. No.: 10/799,778

(22) Filed: Mar. 15, 2004

(65) Prior Publication Data

US 2004/0238207 A1    Dec. 2, 2004

(30) Foreign Application Priority Data

Jun. 2, 2003    (JP)    ............... 2003-156923

(51) Int. Cl.
*H01B 1/22* (2006.01)
*H05K 1/09* (2006.01)

(52) U.S. Cl. .................. 252/512; 428/407; 428/901
(58) Field of Classification Search ............... 252/512; 428/407, 901; 174/257
See application file for complete search history.

(56) References Cited

U.S. PATENT DOCUMENTS 4,521,329 A * 6/1985 Siuta et al. .................. 252/512
5,126,915 A   6/1992 Pepin et al.

FOREIGN PATENT DOCUMENTS

| JP | 62-133002 | 6/1987 |
| JP | 08-007646 | 1/1996 |
| JP | 08-031229 | 2/1996 |
| JP | 09-199857 | 7/1997 |
| JP | 11-353939 | 12/1999 |
| JP | 2000-345201 | 12/2000 |
| JP | 2003-016832 | 1/2003 |

OTHER PUBLICATIONS

"1st 1997 IEMT/IMC Symposium Brochure, sponsored by IEEE CPMT Society & SHM: The Microelectrics Society"; Apr. 16-18, 1997; pp. 1-14.

\* cited by examiner

*Primary Examiner*—Mark Kopec
(74) *Attorney, Agent, or Firm*—Dickstein, Shapiro, LLP.

(57) ABSTRACT

A conductive paste used for forming conductive sinters includes a mixture of a copper powder coated with a metal oxide and a metal oxide powder, and an organic vehicle. The content of the metal oxide used for coating the copper powder is in the range of about 0.05% by weight to about 5% by weight of the total weight of the copper powder coated with the metal oxide and the metal oxide powder, and in addition, the total content of the metal oxide used for coating the copper powder and the metal oxide powder is in the range of about 1% by weight to about 12% by weight of the total weight of the copper powder coated with the metal oxide and the metal oxide powder.

20 Claims, 1 Drawing Sheet

CONDUCTIVE PASTE AND CERAMIC MULTILAYER SUBSTRATE

BACKGROUND OF THE INVENTION

1. Field of the Invention

The present invention relates to a conductive paste, and to a ceramic multilayer substrate including the conductive paste.

2. Description of the Related Art

A ceramic multilayer substrate is used as a circuit board that forms, for example, an integrated circuit, a high frequency electronic circuit or a hybrid circuit. The ceramic multilayer substrate generally includes a ceramic sinter and conductive sinters formed at least at the interior and on the surface of the ceramic sinter.

The ceramic multilayer substrate is formed by preparing a plurality of ceramic green sheets; printing a conductive paste containing a metal powder having a low resistance, such as copper, on a predetermined sheet as a main component; stacking these sheets to prepare a ceramic layered product; and sintering the ceramic layered product. During the sintering, the starting temperatures and the ending temperatures of the shrinkage of each material depend on the characteristics of the materials in the sheets and the conductive paste. For example, two materials have a different sintering temperature range in which the materials shrink are sintered at the same time. As the temperature is increased during the sintering, the shrinkage of the conductive paste begins and is finished, and then the shrinkage of the sheet begins. In this case, a compressive stress due to the solidified conductive sinters affects the shrinkage of the sheets, that is, the compressive stress prevents the shrinkage behavior of the sheet from shrinking uniformly in the thickness direction and in the plane direction. Unfortunately, the sheets are warped and deformed. Furthermore, the conductive sinters are also warped and deformed due to the warp and the deformation of the sheets.

Regarding the problem caused by the difference between the sheets and the conductive paste of the temperature range in which the shrinkages are caused, Japanese Unexamined Patent Application Publication No. 11-353939 discloses the use of a conductive paste having a shrinkage starting temperature higher than the shrinkage ending temperature of the sheets. In other words, after the shrinkage of the sheets is finished, the sintering temperature is increased to gradually shrink the sheets and the conductive paste.

In this case, however, the solidified sheets after shrinking alter the shrinkage of the conductive sinters. Consequently, the conductive sinters can be peeled from the sheets. Furthermore, the ceramic after shrinking is further sintered in order to finish the shrinkage of the conductive paste by further increasing the temperature. This process changes the crystal structure of the sintered ceramic and the larger thermal energy generates glass that is brittle and fragile. This is another typical problem concerning the ceramic.

SUMMARY OF THE INVENTION

Accordingly, it is an object of the present invention to provide a conductive paste and a ceramic multilayer substrate including the conductive paste in order to solve the above problems.

In order to solve the above technical problems, the present invention provides a conductive paste to be sintered with a ceramic formed body at the same time, the conductive paste containing a conductive component, a metal oxide powder and an organic vehicle component, wherein the conductive component is a copper powder coated with a first metal oxide having a melting point exceeding the melting point of copper; the metal oxide powder is a powder of a second metal oxide having a melting point exceeding the melting point of the copper; the content of the first metal oxide is in the range of about 0.05% by weight to about 5% by weight of the total weight of the conductive component, i.e., the coated copper powder and the metal oxide powder; and the total content of the first metal oxide and the powder of the second metal oxide is in the range of about 1% by weight to about 12% by weight of the total weight of the conductive component, i.e., the coated copper powder, and the metal oxide powder.

The first metal oxide is preferably at least one metal oxide selected from the group consisting of $Al_2O_3$, $ZrO_2$, $TiO_2$, $SiO_2$, $Nb_2O_5$ and $Ta_2O_5$. The second metal oxide is also preferably at least one metal oxide selected from the group consisting of $Al_2O_3$, $ZrO_2$, $TiO_2$, $SiO_2$, $Nb_2O_5$ and $Ta_2O_5$.

The present invention further provides a ceramic multilayer substrate including the above conductive paste.

The use of the conductive paste according to the present invention decreases the warp of the ceramic multilayer substrate. Furthermore, the ceramic multilayer substrate according to the present invention has a high adhesiveness between conductive sinters and the substrate.

DESCRIPTION OF THE PREFERRED EMBODIMENTS

Figure 1:
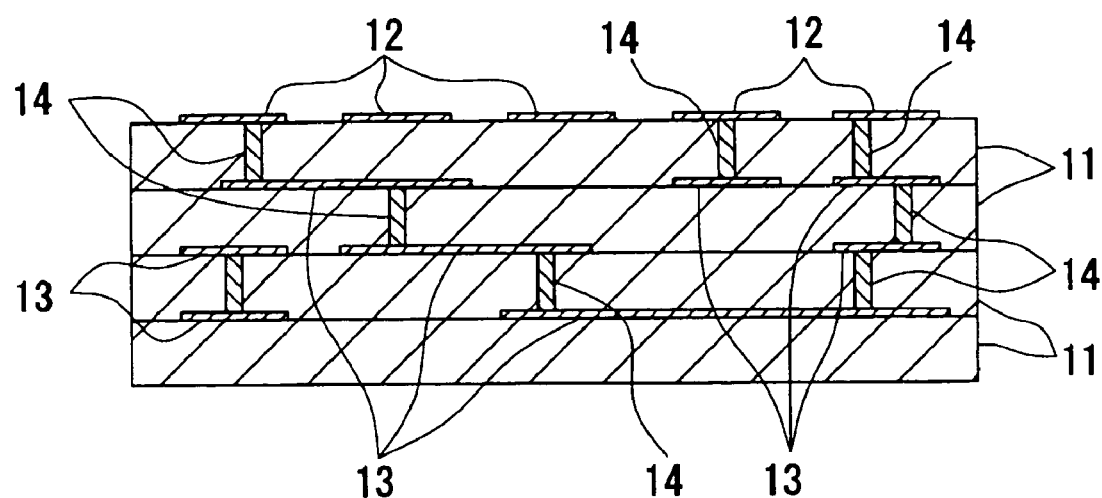
FIG. 1 is a sectional view illustrating a ceramic multilayer substrate that is an example of an electronic component using a conductive paste according to the present invention.

FIG. 1 is an assumed sectional view cutting a ceramic multilayer substrate 1 in the lamination direction, the ceramic multilayer substrate 1 being an embodiment using a conductive paste of the present invention.

The ceramic multilayer substrate 1 includes a ceramic sinter composed of a plurality of ceramic layers 11; and conductive sinters having, for example, outer conductors 12 formed on the surface of the ceramic sinter, inner conductors 13 and via holes 14 both of which are formed at the interior of the ceramic sinter. The ceramic layers 11 and the conductive sinters are produced by sintering ceramic green sheets and a conductive paste of the present invention, respectively, at about 1,000° C. at the same time.

The ceramic green sheets are produced as follows: A paste (slurry) is prepared by mixing a powder mixture including, for example, barium oxide, silicon oxide, alumina, calcium oxide and boron oxide; a binder composed of polyvinyl butyral; a plasticizer composed of di-n-butylphthalate; and a solvent composed of toluene and isopropyl alcohol. The paste (slurry) is formed by, for example, a doctor blade method to form sheets, and is then dried. The paste (slurry) may further include a component that forms glass during the sintering; and sintering aids such as glass, copper oxide and magnesium oxide in advance in order to sinter the ceramic at a lower temperature.

The conductive paste of the present invention includes a conductive component composed of a copper powder coated with, e.g., $Al_2O_3$, i.e., a first metal oxide; a second metal oxide, e.g., $Al_2O_3$ powder; and an organic vehicle.

According to the present invention, the method for coating the surface of the copper powder is not limited. For example, the copper powder can be dispersed in a solution of a metallic compound including, for example, a metal salt, a metal resinate, and a sol of the metal that is to become the metal oxide, and then the solvent is evaporated. Thus, the metallic compound is coated on the surface of the copper powder. Subsequently, the powder is heated in air to oxidize the metallic compound.

In the preparation of the conductive paste, the ratio of each component is as follows. The content of the $Al_2O_3$, i.e., a first metal oxide, used for coating the copper powder is in the range of about 0.05% by weight to 5% by weight of the total weight of the coated copper powder and the $Al_2O_3$ powder, i.e., a second metal oxide. In addition, the total content of the $Al_2O_3$, i.e., a first metal oxide, used for coating the copper powder and the $Al_2O_3$ powder, i.e., a second metal oxide, is in the range of 1% by weight to 12% by weight of the total weight of the coated copper powder and the $Al_2O_3$ powder, i.e., a second metal oxide. The organic vehicle is added to the mixture of the coated copper powder and the $Al_2O_3$ powder having the above composition. The content of the organic vehicle is in the range of about 10% by weight to about 55% by weight of the desired conductive paste. The mixture is stirred and mixed with an automated mortar machine or a three-roll mill to prepare the desired conductive paste.

The median diameter and the shape of the copper powder and the $Al_2O_3$ powder are not limited. Preferably, the powders do not include a coarse powder and an excessively agglomerated powder. The organic vehicle is a mixture of a binder resin and a solvent. Examples of the binder resin include ethyl cellulose, acrylic resins, polyvinyl butyral and methacrylic resins. Examples of the solvent include terpineol, butyl carbitol, butyl carbitol acetate, and alcohols. In terms of the printing property, the viscosity of the paste may be about 10 to 700 Pa.s.

The content of the organic vehicle is preferably about 10% by weight to about 55% by weight of the conductive paste. An excessively large content of the organic vehicle decreases the thickness of conductive sinters, and decreases the compactness, i.e., density, of the conductive sinters. In this case, the resistance of the conductive sinters is unintentionally increased. On the other hand, an excessively small content of the organic vehicle impairs the flatness during printing.

When the ceramic green sheets and the conductive paste are sintered at the same time, the ceramic multilayer substrate 1 may be warped or deformed. In order to suppress this phenomenon when the ceramic green sheets are shrunk, the stress that hinders the shrinkage of the ceramic green sheets must be prevented. The stress is generated because the conductive paste restricts the shrinkage of the ceramic green sheets. In other words, when the ceramic green sheets are shrinking, the conductive paste must start shrinking in order to prevent this problem. More preferably, the ceramic green sheets and the conductive paste start shrinking at the same time. If the conductive paste includes non-coated copper powder as the main component, the conductive paste starts shrinking before the shrinkage of the ceramic green sheets because copper starts shrinking at about 400° C. whereas the ceramic green sheets start shrinking at about 800° C.

According to the present invention, this copper powder is coated with a metal oxide, for example $Al_2O_3$, having a melting point exceeding the melting point of copper in order to intentionally increase the starting temperature of the shrinkage of the conductive paste. Furthermore, the conductive paste of the present invention includes not only the coated copper powder but also $Al_2O_3$ powder. If the conductive paste included the coated copper powder only, a large amount of $Al_2O_3$ used for the coating would be required so that the starting temperature of the shrinkage of the conductive paste is equal to or higher than that of the ceramic. In that case, the coating has an excessively large thickness, and the copper in the coating cannot be sintered sufficiently. Such a sintered conductive paste, which is the conductive sinters in the ceramic multilayer substrate 1, has a large conductor resistance due to the insufficient sintering. Accordingly, in addition to the $Al_2O_3$ coating, $Al_2O_3$ powder must be also added to the conductive paste.

Another advantage of the addition of $Al_2O_3$ powder is that the additional $Al_2O_3$ powder improves the adhesiveness between the conductive sinters and the ceramic layers. During sintering, the $Al_2O_3$ used for coating the copper powder and the $Al_2O_3$ powder, both of which are included in the conductive paste, are mixed with a glass component in the ceramic and are gathered at the boundary face between a ceramic layer and a conductive sinter. According to the present invention, the $Al_2O_3$ is desired to be sintered with the ceramic sheets at the same time. Since the sintering is performed at about 1,000° C., the $Al_2O_3$ is not sufficiently sintered. In addition, the insufficiently sintered $Al_2O_3$ prevents copper located in the vicinity of the $Al_2O_3$ from sintering. As a result, an insufficiently sintered copper is also located in the vicinity of the boundary face. A sintered copper powder has a spherical shape, whereas the insufficiently sintered copper powder does not have a spherical shape. Therefore, the adhesiveness between the conductive sinters and the ceramic layers can be improved by the anchoring effect.

The $Al_2O_3$ powder is located with less restriction because the $Al_2O_3$ powder is not adhered to the copper powder. Accordingly, the $Al_2O_3$ powder can be moved more freely than the $Al_2O_3$ used for coating the copper powder during sintering, and is readily gathered at the boundary face. If the conductive paste does not include the $Al_2O_3$ powder but includes the copper powder coated with $Al_2O_3$ only, the amount of the coating is consequently increased. In this case, the behavior of $Al_2O_3$ during sintering is restricted by the copper; consequently, only a small amount of $Al_2O_3$ is gathered at the boundary face. Accordingly, adding the $Al_2O_3$ powder causes the anchoring effect at the boundary face more effectively, thus improving the adhesiveness between the conductive sinters and the ceramic layers.

Figure 2:
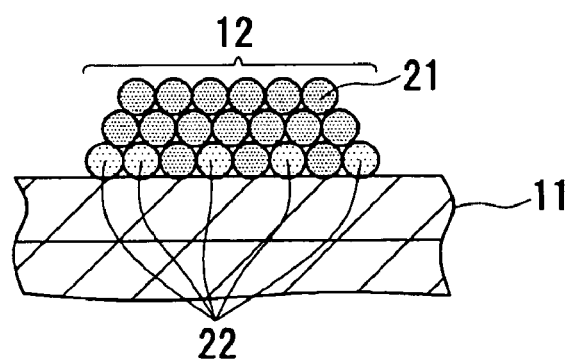
FIG. 2 is a sectional view illustrating particle arrangements of an outer conductor formed in the ceramic multilayer substrate that is an example of an electronic component using a conductive paste according to the present invention.

Furthermore, adding the $Al_2O_3$ powder effectively prevents problems caused in soldering or plating processes. As described above, the $Al_2O_3$ in the conductive paste tends to be mixed with glass component in the ceramic during sintering. For example, in an outer conductor 12, $Al_2O_3$ is gathered at the boundary face between the outer conductor 12 and a ceramic layer 11, whereas the copper is gathered at the opposite side of the boundary face, that is, at the upper portion of the outer conductor 12. FIG. 2 is an enlarged sectional view illustrating particle arrangements of the metallic component in the outer conductor 12. Referring to FIG. 2, copper particles 21 are gathered at the upper portion, whereas $Al_2O_3$ particles 22 are gathered at the lower portion adjacent to the ceramic layer 11. If the conductive paste does not include the $Al_2O_3$ powder but includes the copper powder coated with $Al_2O_3$ only, the amount of the coating is consequently increased. In this case, the behavior of $Al_2O_3$ during sintering is restricted by the copper; therefore, the $Al_2O_3$ is not smoothly gathered at the boundary face between the outer conductor 12 and a ceramic layer 11. Consequently, the $Al_2O_3$ particles 22 may partly remain at the upper portion of the outer conductor 12. In general, plating cannot be performed on $Al_2O_3$. In the above case, therefore, even if plating or soldering is performed on the outer conductor 12 in order to mount an element, problems caused by the insufficient plating, for example, a poor adhesiveness of the plating and a poor wettability of soldering, may be present. Adding the $Al_2O_3$ powder increases the amount of $Al_2O_3$ that is gathered at the boundary face. In this case, the $Al_2O_3$ particles 22 do not remain at the upper portion of the outer conductor 12. Consequently, adding the $Al_2O_3$ powder can suppress the problems, for example, the poor adhesiveness of the plating and the poor wettability of soldering.

According to the present embodiment, as described above, both the metal oxide that is used for coating copper and the metal oxide powder to be mixed are $Al_2O_3$. However, $ZrO_2$, $TiO_2$, $SiO_2$, $Nb_2O_5$ or $Ta_2O_5$ may be used as the metal oxide instead of $Al_2O_3$. The metal oxide that is used for coating copper and the metal oxide powder to be mixed may be different as long as high melting point metal oxides are used.

Experiments

The following experiments were performed in order to verify the adequacy of the numerical range of each component in preparation of the above conductive paste.

Firstly, copper powder coated with a metal oxide and a metal oxide powder were prepared. An organic vehicle was added to the powders and then mixed by stirring to prepare conductive paste samples according to the composition shown in Table 1. The content of the organic vehicle was uniformly 20% by weight in all of the conductive paste samples. Referring to Table 1, the content of each component is represented by parts by weight relative to 100 parts of the conductive paste excluding the organic vehicle. The metal oxides that were used for coating copper and the metal oxide powder were the substance that is marked with symbol * in Table 1.

Referring to Sample No. 1 in Table 1, for example, copper powder (93% by weight) is coated with $Al_2O_3$ (0.02% by weight), and the coated powder is mixed with $Al_2O_3$ powder (6.98% by weight). Consequently, the content of the $Al_2O_3$ in the conductive paste is 7% by weight in total.

Starting temperatures of the shrinkage of the plurality of the above conductive pastes were determined in advance by the following method. Firstly, a conductive paste was dried at 150° C. for 10 minutes. Then the paste was sieved through a 200-mesh sieve. The sieved powder was charged in a die and was pressed to form a cylindrical compact (6 mm in diameter and 3 mm in height). The pressure during pressing was the same as the pressure at which ceramic sheets were pressed to produce a ceramic layered product as described later. The dimensional change in the height direction of the compact was measured by thermal mechanical analysis (TMA), while the compact was sintered in nitrogen at the heating rate of 20° C./min. In the thermal mechanical analysis, the temperature at which the compact starts shrinking was defined as the starting temperature of the shrinkage of the conductive paste. The starting temperatures of the shrinkage of ceramic green sheets described later were also determined in advance by the same method.

Subsequently, a plurality of the ceramic green sheets having the thickness of 50 μm was prepared. In a substrate produced by the ceramic sheets, conductive sinters were disposed on a single main surface of a predetermined sheet. A conductive paste was printed on the predetermined ceramic green sheet to realize uniformly disposed wiring patterns such that the printed area occupied 50% of the main surface and, in addition. A plurality of the ceramic green sheets was laminated such that the predetermined ceramic green sheet was disposed on the top of the layered product. The laminated sheets were pressed to prepare the ceramic layered product. The ceramic layered product samples prepared are shown in Table 1. All of the ceramic layered products were sintered at 975° C. Then, the sintered layered products were cut such that the sintered products had a dimension of 51 mm×51 mm×0.8 mm. The sintered layered product samples were used for evaluating the warp of the substrate and the adhesiveness between the conductive sinters and the substrate.

The warp of the substrate was measured with a laser surface roughness meter. If the $R_{max}$ in the surface roughness of a substrate was 30 μm or less, the substrate was defined as a good sample. The adhesiveness was measured by a following method. The outer conductors formed on the top layer of the substrate were covered with Ni and Au by plating. A mild steel wire (0.5 mm in diameter) was connected to a plated portion by soldering, and then the wire connected to the substrate was moved upward in vertical direction at a constant rate of 20 mm/min. The breaking stress of an outer conductor was measured. If the breaking stress of the outer conductor was 16 N or more, the substrate was defined as a good sample.

In Table 1, symbol G in the bottom column represents that the substrate was determined as a good sample in terms of the warp of the substrate and the adhesiveness. Symbol NG in the bottom column in Table 1 represents that the substrate was determined as a bad sample in terms of the warp of the substrate and/or the adhesiveness.

TABLE 1

| Sample No. | | | | 1 | 2 | 3 | 4 | 5 | 6 | 7 | 8 | 9 | 10 | 11 |
|---|---|---|---|---|---|---|---|---|---|---|---|---|---|---|
| Composition | Coated Copper Powder | Copper Powder (1) | % by weight | 93 | 93 | 93 | 93 | 93 | 99.5 | 99 | 88 | 86.5 | 94.5 | 94.5 |
| | | Metal Oxide (2) | % by weight | 0.02 | 0.05 | 2.5 | 5 | 7 | 0.5 | 0.5 | 0.5 | 0.5 | 2.5 | 2.5 |
| | Metal Oxide Powder (3) | | % by weight | 6.98 | 6.95 | 4.5 | 2 | 0 | 0 | 0.5 | 11.5 | 13 | 3 | 3 |
| | Total of (1) + (2) + (3) | | % by weight | 100 | 100 | 100 | 100 | 100 | 100 | 100 | 100 | 100 | 100 | 100 |
| | Total of Metal Oxide ((2) + (3)) | | % by weight | 7 | 7 | 7 | 7 | 7 | 0.5 | 1 | 12 | 13.5 | 5.5 | 5.5 |

TABLE 1-continued

|  |  |  |  |  |  |  |  |  |  |  |  |  |
|---|---|---|---|---|---|---|---|---|---|---|---|---|
|  | Metal Oxide | Al₂O₃ | * | * | * | * | * | * | * | * | * |  |  |
|  |  | ZrO₂ |  |  |  |  |  |  |  |  |  | * |  |
|  |  | TiO₂ |  |  |  |  |  |  |  |  |  |  | * |
|  |  | SiO₂ |  |  |  |  |  |  |  |  |  |  |  |
|  |  | Nb₂O₅ |  |  |  |  |  |  |  |  |  |  |  |
|  |  | Ta₂O₅ |  |  |  |  |  |  |  |  |  |  |  |
| Measurement Results | Starting Temperature of Shrinkage of Ceramic (° C.) |  | 885 | 885 | 885 | 885 | 885 | 885 | 885 | 885 | 885 | 885 | 885 |
|  | Starting Temperature of Shrinkage of Conductive Paste (° C.) |  | 650 | 905 | 955 | 960 | 995 | 950 | 950 | 955 | 955 | 960 | 955 |
|  | Warp of Substrate (μm) |  | 40 | 20 | 15 | 30 | 35 | 40 | 15 | 15 | 45 | 25 | 20 |
|  | Adhesiveness (N) |  | 12 | 22 | 25 | 26 | # | 8 | 16 | 29 | 27 | 24 | 23 |
| Determination |  |  | NG | G | G | G | NG | NG | G | G | NG | G | G |

| Sample No. |  |  |  | 12 | 13 | 14 | 15 | 16 | 17 | 18 | 19 | 20 | 21 | 22 |
|---|---|---|---|---|---|---|---|---|---|---|---|---|---|---|
| Composition | Coated Copper Powder | Copper Powder (1) | % by weight | 94.5 | 94.5 | 94.5 | 94.5 | 94.5 | 93 | 93 | 99.5 | 99.5 | 86.5 | 86.5 |
|  |  | Metal Oxide (2) | % by weight | 2.5 | 2.5 | 2.5 | 0.02 | 0.02 | 7 | 7 | 0.5 | 0.5 | 2.5 | 2.5 |
|  | Metal Oxide Powder (3) |  | % by weight | 3 | 3 | 3 | 5.48 | 5.48 | 0 | 0 | 0 | 0 | 11 | 11 |
|  | Total of (1) + (2) + (3) |  | % by weight | 100 | 100 | 100 | 100 | 100 | 100 | 100 | 100 | 100 | 100 | 100 |
|  | Total of Metal Oxide ((2) + (3)) |  | % by weight | 5.5 | 5.5 | 5.5 | 5.5 | 5.5 | 7 | 7 | 0.5 | 0.5 | 13.5 | 13.5 |
|  | Metal Oxide | Al₂O₃ |  |  |  |  |  |  |  |  |  |  |  |  |
|  |  | ZrO₂ |  |  |  |  | * |  | * |  |  |  |  |  |
|  |  | TiO₂ |  |  |  |  |  | * |  | * |  |  |  |  |
|  |  | SiO₂ |  | * |  |  |  |  |  |  | * |  |  |  |
|  |  | Nb₂O₅ |  |  | * |  |  |  |  |  |  |  | * |  |
|  |  | Ta₂O₅ |  |  |  | * |  |  |  |  |  | * |  | * |
| Measurement Results | Starting Temperature of Shrinkage of Ceramic (° C.) |  |  | 885 | 885 | 885 | 885 | 885 | 885 | 885 | 885 | 885 | 885 | 885 |
|  | Starting Temperature of Shrinkage of Conductive Paste (° C.) |  |  | 960 | 960 | 970 | 725 | 750 | 990 | 995 | 900 | 890 | 995 | 980 |
|  | Warp of Substrate (μm) |  |  | 15 | 20 | 15 | 35 | 35 | 45 | 40 | 40 | 45 | 50 | 45 |
|  | Adhesiveness (N) |  |  | 24 | 22 | 24 | 23 | 22 | # | # | 7 | 6 | 28 | 27 |
| Determination |  |  |  | G | G | G | NG | NG | NG | NG | NG | NG | NG | NG |

: Unsuccessful Plating   G: Good   NG: No Good

These experimental results showed that the preferable composition of the conductive paste was as follows: The content of a first metal oxide used for coating the copper powder is preferably in the range of about 0.05% by weight to about 5% by weight of the total weight of the coated copper powder and the metal oxide powder, i.e., the powder of a second metal oxide. In addition, the total content of the first metal oxide used for coating the copper powder and the powder of the second metal oxide is preferably in the range of about 1% by weight to about 12% by weight of the total weight of the coated copper powder and the metal oxide powder, i.e., the powder of a second metal oxide.

What is claimed is:

1. A conductive paste adapted to be sintered with a ceramic body at the same time, the conductive paste comprising a conductive component and an organic vehicle,
    wherein the conductive component comprises a copper powder coated with a first metal oxide having a melting point exceeding the melting point of copper wherein the first metal oxide comprises at least one metal oxide selected from the group consisting of Al₂O₃, ZrO₂, TiO₂, SiO₂, Nb₂O₅ and Ta₂O₅ and a powder of a second metal oxide having a melting point exceeding the melting point of the copper;
    the content of the first metal oxide is in the range of about 0.05% by weight to about 5% by weight of the total weight of the coated copper powder and the metal oxide powder; and
    the total content of the first metal oxide and the powder of the second metal oxide is in the range of about 1% by weight to about 12% by weight of the total weight of the coated copper powder and the metal oxide powder.

2. The conductive paste according to claim 1, wherein the second metal oxide comprises at least one metal oxide selected from the group consisting of Al₂O₃, ZrO₂, TiO₂, SiO₂, Nb₂O₅ and Ta₂O₅.

3. A ceramic multilayer substrate comprising a ceramic sinter and a conductive sinter, wherein the conductive sinter is a sintered conductive paste according to claim 2.

4. The conductive paste according to claim 2, wherein the first metal oxide is Al₂O₃.

5. A ceramic multilayer substrate comprising a ceramic sinter and a conductive sinter, wherein the conductive sinter is a sintered conductive paste according to claim 4.

6. The conductive paste according to claim 4, wherein the second metal oxide is Al₂O₃.

7. A ceramic multilayer substrate comprising a ceramic sinter and a conductive sinter, wherein the conductive sinter is a sintered conductive paste according to claim 6.

8. The conductive paste according to claim 6, wherein the viscosity of the paste is about 10 to 700 Pa·s.

9. A ceramic multilayer substrate comprising a ceramic sinter and a conductive sinter, wherein the conductive sinter is a sintered conductive paste according to claim 8.

10. The conductive paste according to claim 1, wherein the first metal oxide is Al₂O₃.

11. A ceramic multilayer substrate comprising a ceramic sinter and a conductive sinter, wherein the conductive sinter is a sintered conductive paste according to claim 10.

12. The conductive paste according to claim 1, wherein the second metal oxide is $Al_2O_3$.

13. The conductive paste according to claim 12, wherein the vehicle is about 10–55 weight percent thereof.

14. A ceramic multilayer substrate comprising a ceramic sinter and a conductive sinter, wherein the conductive sinter is a sintered conductive paste according to claim 13.

15. A ceramic multilayer substrate comprising a ceramic sinter and a conductive sinter, wherein the conductive sinter is a sintered conductive paste according to claim 12.

16. The conductive paste according to claim 1, wherein the viscosity of the paste is about 10 to 700 Pa·s.

17. A ceramic multilayer substrate comprising a ceramic sinter and a conductive sinter, wherein the conductive sinter is a sintered conductive paste according to claim 16.

18. A ceramic multilayer substrate comprising a ceramic sinter and a conductive sinter, wherein the conductive sinter is a sintered conductive paste according to claim 1.

19. A conductive paste adapted to be sintered with a ceramic body at the same time, the conductive paste comprising a conductive component and an organic vehicle, wherein the conductive component comprises a copper powder coated with a first metal oxide having a melting point exceeding the melting point of copper and a powder of a second metal oxide having a melting point exceeding the melting point of the copper, wherein the second metal oxide comprises at least one metal oxide selected from the group consisting of $Al_2O_3$, $ZrO_2$, $TiO_2$, $SiO_2$, $Nb_2O_5$ and $Ta_2O_5$; the content of the first metal oxide is in the range of about 0.05% by weight to about 5% by weight of the total weight of the coated copper powder and the metal oxide powder; and the total content of the first metal oxide and the powder of the second metal oxide is in the range of about 1% by weight to about 12% by weight of the total weight of the coated copper powder and the metal oxide powder.

20. A ceramic multilayer substrate comprising a ceramic sinter and a conductive sinter, wherein the conductive sinter is a sintered conductive paste according to claim 19.

* * * * *